(12) United States Patent
Paek et al.

(10) Patent No.: US 10,128,176 B2
(45) Date of Patent: Nov. 13, 2018

(54) SEMICONDUCTOR DEVICE AND MANUFACTURING METHOD THEREOF

(71) Applicant: Amkor Technology, Inc., Tempe, AZ (US)

(72) Inventors: Jong Sik Paek, Incheon (KR); William Huang, Gwangju (KR); Raymond Tsao, Hsinchu (KR); Mike Liang, Zhubei (KR)

(73) Assignee: AMKOR TECHNOLOGY, INC., Tempe, AZ (US)

( * ) Notice: Subject to any disclaimer, the term of this patent is extended or adjusted under 35 U.S.C. 154(b) by 0 days.

(21) Appl. No.: 15/149,147

(22) Filed: May 8, 2016

(65) Prior Publication Data

US 2017/0170107 A1 Jun. 15, 2017

(30) Foreign Application Priority Data

Dec. 9, 2016 (KR) ........................ 10-2015-0174902

(51) Int. Cl.
*H01L 23/498* (2006.01)
*H01L 21/48* (2006.01)
*H01L 23/00* (2006.01)

(52) U.S. Cl.
CPC ...... *H01L 23/49827* (2013.01); *H01L 21/486* (2013.01); *H01L 21/4846* (2013.01); *H01L 21/4853* (2013.01); *H01L 23/498* (2013.01); *H01L 23/49816* (2013.01); *H01L 24/05* (2013.01); *H01L 2224/11* (2013.01); *H01L 2224/13022* (2013.01); *H01L 2224/13024* (2013.01); *H01L 2224/94* (2013.01)

(58) Field of Classification Search
CPC ...... H01L 24/03–24/06; H01L 21/4846; H01L 21/4853; H01L 21/486; H01L 23/49827; H01L 23/49816; H01L 23/498
See application file for complete search history.

(56) References Cited

U.S. PATENT DOCUMENTS

| 2003/0013290 A1* | 1/2003 | Greer ..................... H01L 24/11 438/612 |
| 2006/0079025 A1* | 4/2006 | Kripesh .................. H01L 24/73 438/113 |
| 2007/0108573 A1* | 5/2007 | Chung ................ H01L 23/3114 257/678 |
| 2009/0243098 A1* | 10/2009 | Farooq .................... H01L 24/11 257/738 |

(Continued)

FOREIGN PATENT DOCUMENTS

| JP | 2011-049530 A | 3/2011 |
| KR | 10-2009-0037589 A | 4/2009 |

OTHER PUBLICATIONS

Korean Patent Office, Office action in application No. 10-2015-0174902 dated Feb. 1, 2017 dated Jan. 6, 2017 (7 pages).

*Primary Examiner* — Christine Enad
(74) *Attorney, Agent, or Firm* — McAndrews, Held & Malloy, Ltd.

(57) ABSTRACT

A semiconductor device and a method of manufacturing a semiconductor device. As a non-limiting example, various aspects of this disclosure provide a semiconductor package, and method of manufacturing thereof, that comprises a signal redistribution structure that comprises an anti-oxidation layer.

20 Claims, 11 Drawing Sheets

(56) References Cited

U.S. PATENT DOCUMENTS

| | | | |
|---|---|---|---|
| 2015/0041982 A1* | 2/2015 | Hau-Riege | H01L 23/53266 257/753 |
| 2015/0137379 A1* | 5/2015 | Wang | H01L 21/76801 257/773 |
| 2016/0284639 A1* | 9/2016 | Chen | H01L 23/525 |
| 2017/0047313 A1* | 2/2017 | Yang | H01L 23/15 |

* cited by examiner

SEMICONDUCTOR DEVICE AND MANUFACTURING METHOD THEREOF

CROSS-REFERENCE TO RELATED APPLICATIONS/INCORPORATION BY REFERENCE

The present application makes reference to, claims priority to, and claims the benefit of Korean Patent Application No. 10-2015-0174902, filed on Dec. 9, 2015, in the Korean Intellectual Property Office and titled "SEMICONDUCTOR DEVICE AND FABRICATING METHOD THEREOF," the contents of which are hereby incorporated herein by reference in their entirety.

BACKGROUND

Present semiconductor devices and methods for manufacturing semiconductor devices are inadequate, for example resulting in excess cost, decreased reliability, or package sizes that are too large. Further limitations and disadvantages of conventional and traditional approaches will become apparent to one of skill in the art, through comparison of such approaches with the present disclosure as set forth in the remainder of the present application with reference to the drawings.

SUMMARY

Figure 1:
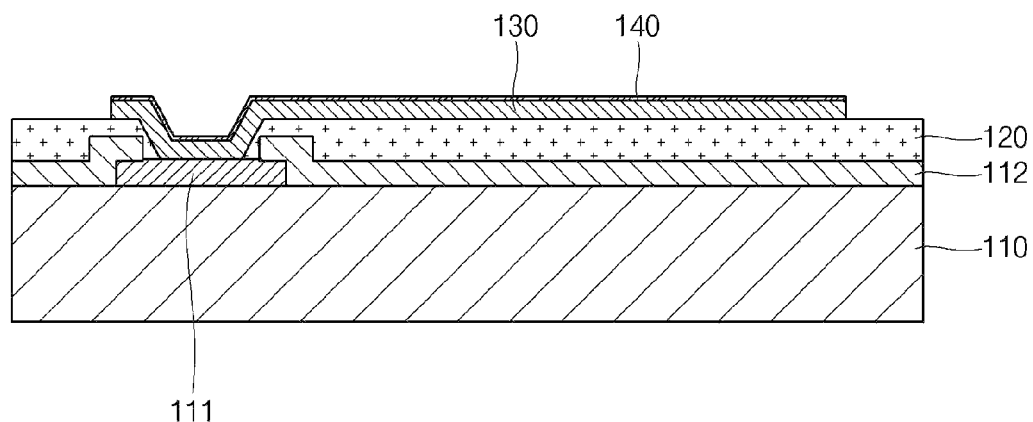
FIGS. 1 through 5 are cross-sectional views illustrating a method of manufacturing a semiconductor device, according to an embodiment of the present invention.

Various aspects of this disclosure provide a semiconductor device and a method of manufacturing a semiconductor device. As a non-limiting example, various aspects of this disclosure provide a semiconductor package, and method of manufacturing thereof, that comprises a signal redistribution structure that comprises an anti-oxidation layer.

DETAILED DESCRIPTION OF VARIOUS ASPECTS OF THE DISCLOSURE

The following discussion presents various aspects of the present disclosure by providing examples thereof. Such examples are non-limiting, and thus the scope of various aspects of the present disclosure should not necessarily be limited by any particular characteristics of the provided examples. In the following discussion, the phrases "for example," "e.g.," and "exemplary" are non-limiting and are generally synonymous with "by way of example and not limitation," "for example and not limitation," and the like.

As utilized herein, "and/or" means any one or more of the items in the list joined by "and/or". As an example, "x and/or y" means any element of the three-element set {(x), (y), (x, y)}. In other words, "x and/or y" means "one or both of x and y." As another example, "x, y, and/or z" means any element of the seven-element set {(x), (y), (z), (x, y), (x, z), (y, z), (x, y, z)}. In other words, "x, y and/or z" means "one or more of x, y, and z."

The terminology used herein is for the purpose of describing particular examples only and is not intended to be limiting of the disclosure. As used herein, the singular forms are intended to include the plural forms as well, unless the context clearly indicates otherwise. It will be further understood that the terms "comprises," "includes," "comprising," "including," "has," "have," "having," and the like when used in this specification, specify the presence of stated features, integers, steps, operations, elements, and/or components, but do not preclude the presence or addition of one or more other features, integers, steps, operations, elements, components, and/or groups thereof.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present disclosure. Similarly, various spatial terms, such as "upper," "lower," "side," and the like, may be used in distinguishing one element from another element in a relative manner. It should be understood, however, that components may be oriented in different manners, for example a semiconductor device may be turned sideways so that its "top" surface is facing horizontally and its "side" surface is facing vertically, without departing from the teachings of the present disclosure.

In the drawings, the thickness or size of layers, regions, and/or components may be exaggerated for clarity. Accordingly, the scope of this disclosure should not be limited by such thickness or size. Additionally, in the drawings, like reference numerals may refer to like elements throughout the discussion.

It will also be understood that when an element A is referred to as being "connected to" or "coupled to" an element B, the element A can be directly connected to the element B or indirectly connected to the element B (e.g., an intervening element C (and/or other elements) may be present between the element A and the element B).

Various aspects of the present disclosure relate to a semiconductor device and a manufacturing (or fabricating) method thereof, which can increase the reliability of the semiconductor device by preventing delamination from occurring on a redistribution layer formed on a surface (e.g., a top surface, etc.) of a semiconductor die According to the recent tendency toward lightweight, slim and compact products, a semiconductor device incorporated into an electronic product often needs to have increased functionality and reduced size. In order to satisfy such demand, a variety of packaging techniques of semiconductor devices have been proposed.

To this end, in recent years, there has been developed a chip scale package (CSP) in which a wiring layer is directly formed on a top surface of a semiconductor die without using a substrate and a conductive ball is formed. Since downsizing has enabled the reduction in a size of the semiconductor die, the chip scale package is gradually drawing considerable attention.

Various aspects of the present disclosure provide a semiconductor device and a manufacturing (or fabricating) method thereof, which can increase the reliability of the semiconductor device by preventing delamination from occurring on a redistribution layer formed on a surface (e.g., a top surface, etc.) of a semiconductor die.

According to an aspect of the present invention, there is provided a semiconductor device including a semiconductor die including a conductive pad on one surface thereof, a first redistribution layer formed on the one surface of the semiconductor die, and a second redistribution layer formed on the first redistribution layer and electrically connected to the conductive pad, wherein an anti-oxidation layer is formed on a top surface of the second redistribution layer.

The anti-oxidation layer may be formed from an oxide layer of the second redistribution layer. A material of the second redistribution layer may be different from that of the first redistribution layer. The second redistribution layer may be made of at least one selected from the group consisting of tin (Sn), silver (Ag), nickel (Ni), titanium (Ti), titanium-tungsten alloy (TiW), aluminum (Al) and chromium (Cr) (or chrome). An intermetallic compound may be formed at an interface between the second redistribution layer and the first redistribution layer. The anti-oxidation layer may be a third redistribution layer including gold (Au) and formed on the second redistribution layer. The second redistribution layer may be formed to a thickness of 2 μm or greater. The first redistribution layer may be made of copper (Cu).

According to another aspect of the present invention, there is provided a method of manufacturing (or fabricating) a semiconductor device, the manufacturing method including forming a first redistribution layer on one surface of a semiconductor die that includes a conductive pad, to be electrically connected to the conductive pad, forming a second redistribution layer on the first redistribution layer, and forming an anti-oxidation layer on a top surface of the second redistribution layer, wherein the anti-oxidation layer is formed by oxidizing the second redistribution layer.

The manufacturing method may further including forming a dielectric layer on the anti-oxidation layer, wherein the anti-oxidation layer covers the first redistribution layer at least in an area covered by the dielectric layer. The anti-oxidation layer may be formed from an oxide layer of the second redistribution layer. The second redistribution layer may be formed using at least one selected from the group consisting of tin (Sn), silver (Ag), nickel (Ni), titanium (Ti), titanium-tungsten alloy (TiW), aluminum (Al) and chromium (Cr) (or chrome). The second redistribution layer may be formed such that an intermetallic compound is formed at an interface between the first redistribution layer and the second redistribution layer. The second redistribution layer may be formed to a thickness of 2 μm or greater. The first redistribution layer may be made of copper (Cu).

According to still another aspect of the present invention, there is provided a method of manufacturing (or fabricating) a semiconductor device, the fabricating method including forming a first redistribution layer on one surface of a semiconductor die that includes a conductive pad, to be electrically connected to the conductive pad, forming a second redistribution layer on the first redistribution layer, and forming an anti-oxidation layer on a top surface of the second redistribution layer, wherein the anti-oxidation layer includes a third redistribution layer formed using a separate metal on the second redistribution layer.

The anti-oxidation layer including gold (Au) may be formed on the second redistribution layer. The second redistribution layer may be formed to a thickness of 2 μm or greater. The second redistribution layer may be formed such that an intermetallic compound is formed at an interface between the first redistribution layer and the second redistribution layer. A dielectric layer may be formed on the anti-oxidation layer, wherein the anti-oxidation layer is exposed through at least a region of the dielectric layer.

As described above, in the semiconductor device and the fabricating method thereof according to embodiments of the present invention, a second redistribution layer made of a metal is formed on a first redistribution layer made of copper (Cu) or an oxide layer having a high density is formed on a top surface of the second redistribution layer, thereby preventing the underlying first redistribution layer from being oxidized and preventing delamination from occurring to an interface between the first redistribution layer and the second redistribution layer Hereinafter, examples of various embodiments of the invention will be described in detail with reference to the accompanying drawings such that they can easily be made and used by those skilled in the art.

A method of manufacturing (or fabricating) a semiconductor device according to an embodiment of the present invention will now be described with reference to FIGS. 1 through 5.

FIGS. 1 through 5 are cross-sectional views illustrating a method of manufacturing a semiconductor device (100) according to an embodiment of the present invention.

First, referring to FIG. 1, the semiconductor device according to an embodiment of the present invention may first include forming a first dielectric layer 120, a first redistribution layer 130 (or conductive layer) and a second redistribution layer 140 (or conductive layer) on a top surface of a semiconductor die 110.

Here, the semiconductor die 110 may include an integrated circuit chip separated from a semiconductor wafer. In addition, the semiconductor die 110 may include, for example, electrical circuits, such as central processing units (CPUs), digital signal processors (DSPs), network processors, power management units, audio processors, RF circuits, wireless baseband system on chip (SoC) processors, sensors, and application specific integrated circuits (ASICs). The semiconductor die 110 may also, for example, be part of a wafer of a plurality of semiconductor die.

In addition, the semiconductor die 110 may input/output electrical signals on its one surface through the conductive pad 111. The conductive pad 111 may be connected to internal patterns of the semiconductor die 110 and may be generally made of aluminum (Al), but the scope of this disclosure is not limited thereto. In addition, the semiconductor die 110 is formed to surround the remaining region other than a region to which the conductive pad 111 is exposed through a die passivation layer 112 (or dielectric layer). The one surface of the semiconductor die 110 generally made of silicon (Si) may be insulated from the region other than the conductive pad 111.

The first dielectric layer 120 is formed to surround the conductive pad 111 of the semiconductor die 110. The first dielectric layer 120 may be generally made of a material selected from, but not limited to, a polymer such as polyimide (PI) or benzocyclobutene (BCB), polybenzoxazole (PBO), and equivalents thereof. The first dielectric layer 120 electrically insulates redistribution layers 130 and 140 formed thereon from the region other than the conductive pad 111 of the semiconductor die 110.

The first redistribution layer 130 is formed along the top surface of the first dielectric layer 120. In addition, the first redistribution layer 130 is electrically connected to the conductive pad 111 of the semiconductor die 110 exposed to the outside of the first dielectric layer 120. The first redistribution layer 130 may be formed of copper (Cu), which is a metal having an excellent electrical property, but the scope of this disclosure is not limited thereto. The first redistribution layer 130 may be formed by electroless plating or electroplating, but aspects of the preset invention are not limited thereto. The first redistribution layer 130 may be extended from the conductive pad 111 along the first dielectric layer 120 according to the design, thereby forming patterns as required. Therefore, the degree of freedom in the design can be increased by the first redistribution layer 130.

The second redistribution layer 140 is formed on the first redistribution layer 130. The second redistribution layer 140 may be formed by electroless plating or electroplating, but aspects of the preset invention are not limited thereto. The second redistribution layer 140 may prevent an oxide layer from being formed on the first redistribution layer 130, thereby suppressing delamination.

In an example implementation, copper (Cu) used in forming the first redistribution layer 130 is likely to form a copper oxide ($Cu_2O$) layer. In addition, delamination is liable to occur to an interface between copper (Cu) and the copper oxide ($Cu_2O$) layer having greater than a predetermined thickness. Therefore, when an oxide layer is formed on the first redistribution layer 130, failures or damages may be caused to the semiconductor device due to the delamination occurring to the oxide layer and the first redistribution layer 130.

The second redistribution layer 140 is formed on the first redistribution layer 130 and prevents the copper oxide ($Cu_2O$) layer from being formed on the top surface of the first redistribution layer 130. Therefore, since the delamination does not occur, the reliability of the semiconductor device can be improved.

To this end, the second redistribution layer 140 may be made of tin (Sn), but the scope of this disclosure is not limited thereto. In addition, when the second redistribution layer 140 is formed of a thin film, the tin (Sn) component of the second redistribution layer 140 may react with copper (Cu) of the first redistribution layer 130 to form an intermetallic compound (IMC), thereby forming the second redistribution layer 140 having a stable structure.

Figure 2:
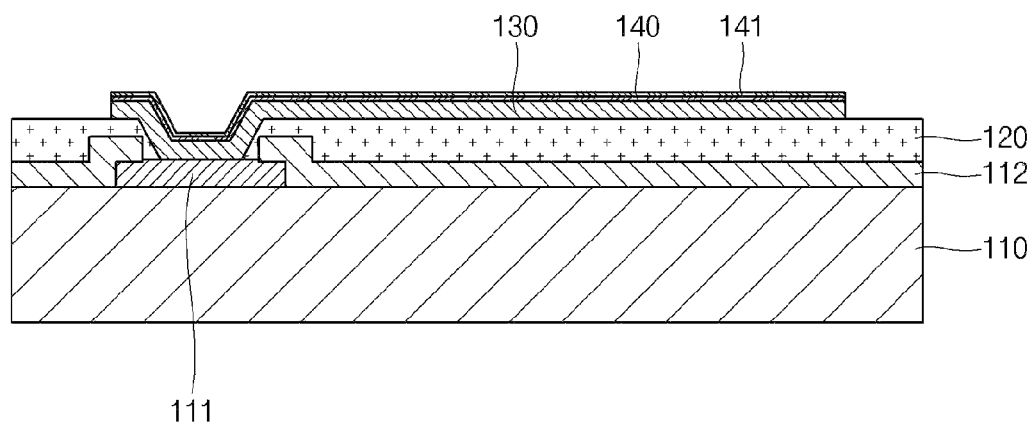

Referring to FIG. 2, the intermetallic compound used to form the second redistribution layer 140 is capable of forming an oxide layer 141 that is very thin and has a high density on the top surface of the second redistribution layer 140. Therefore, the oxide layer 141 may prevent oxygen from penetrating into the first redistribution layer 130, thereby effectively suppressing the oxide layer from being formed on the first redistribution layer 130. In addition, since the oxide layer 141 has a very small thickness, it can be easily removed from a potential region where a conductive ball is to be formed in a subsequent process.

Figure 3:
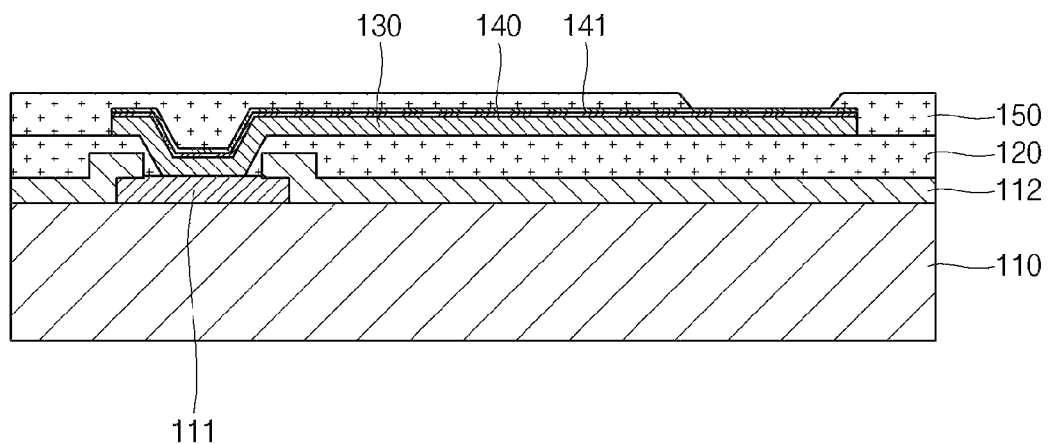

Referring to FIG. 3, a second dielectric layer 150 is formed to surround the second redistribution layer 140 and the oxide layer 141. Like the first dielectric layer 120, the second dielectric layer 150 may be generally made of a material selected from, but not limited to, a polymer such as polyimide (PI) or benzocyclobutene (BCB), polybenzoxazole (PBO), and equivalents thereof. The second dielectric layer 150 is formed to surround the remaining region other than the potential region where the conductive ball (or other interconnection structure, for example a next conductive layer, conductive via, etc.) is to be formed in a subsequent process.

Figure 4:
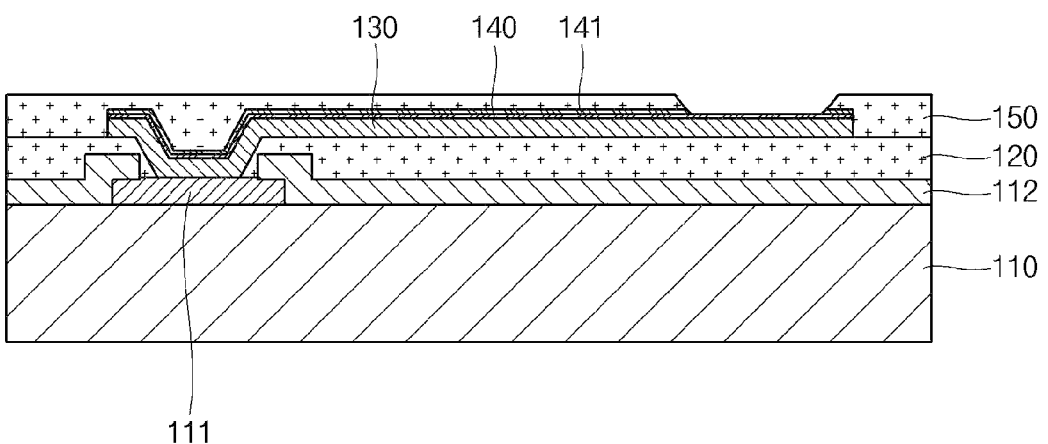

Referring to FIG. 4, the oxide layer 141 of the second redistribution layer 140 is removed from the region where the second dielectric layer 150 is exposed. The oxide layer 141 may be removed through a flux. If the oxide layer 141 is removed, the tin (Sn)-copper (Cu) intermetallic compound (IMC) forming the second redistribution layer 140 may be exposed.

Figure 5:
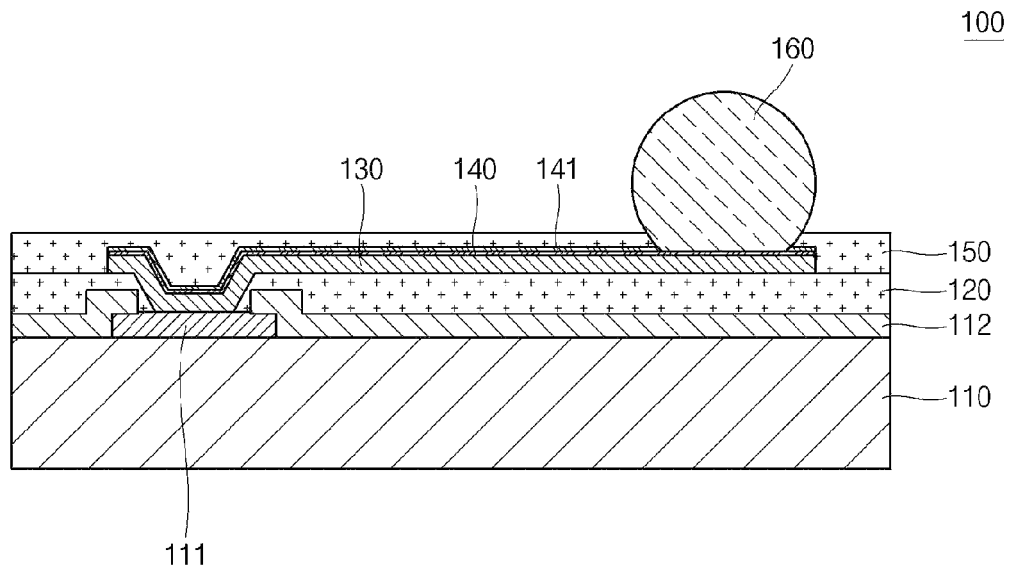

Next, referring to FIG. 5, a conductive ball 160 (or other interconnection structure, for example metal post or pillar, conductive bump, etc.) is coupled to the second redistribution layer 140 exposed to the outside of the second dielectric layer 150. The conductive ball 160 may be formed using a solder and may be formed to have a substantially spherical shape, as illustrated in FIG. 5. The semiconductor device 100 according to an embodiment of the present invention may be electrically coupled to an external circuit or another device through the conductive ball 160.

As described above, the semiconductor device 100 according to an embodiment of the present invention can prevent the underlying first redistribution layer 130 from being oxidized by forming the second redistribution layer 140 made of a tin (Sn) alloy on the first redistribution layer 130 made of copper (Cu) to induce the intermetallic compound and forming the oxide layer 141 having a high density on the intermetallic compound, thereby preventing delamination from occurring.

A method of manufacturing (or fabricating) a semiconductor device according to another embodiment of the present invention will now be described with reference to FIGS. 6 through 10.

FIGS. 6 through 10 are cross-sectional views illustrating a method of manufacturing (or fabricating) a semiconductor device according to another embodiment of the present invention. A same or similar functional component is denoted by a same reference numeral and the following description will focus on differences between the present and other embodiments.

Figure 6:
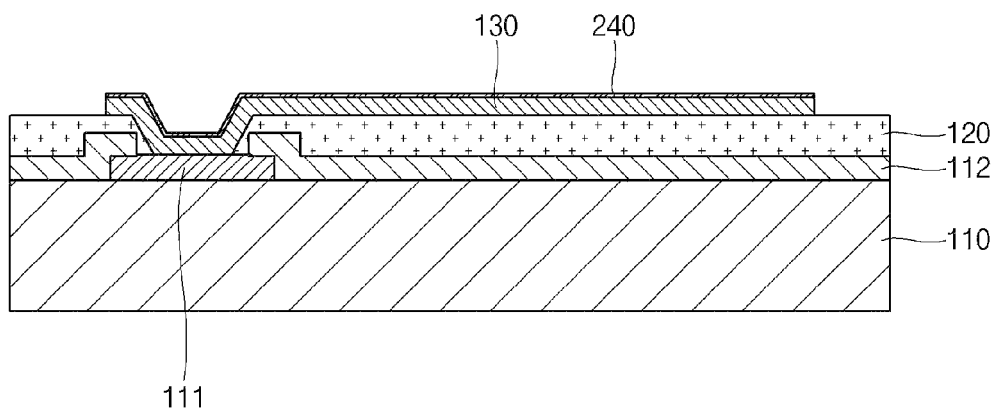
FIGS. 6 through 10 are cross-sectional views illustrating a method of manufacturing of a semiconductor device, according to another embodiment of the present invention.

Referring to FIG. 6, the method of manufacturing (or fabricating) a semiconductor device (200) according to another embodiment of the present invention may first include forming a first dielectric layer 120, a first redistribution layer 130 (or conductive layer) and a second redistribution layer 240 (or conductive layer) on a top surface of a semiconductor die 110.

The second redistribution layer 240 (or conductive layer) may be made of a metal, such as silver (Ag) or nickel (Ni), but the scope of this disclosure is not limited thereto. The metal is electrically connected to the first redistribution layer 130 and may be formed along a top surface of the first dielectric layer 120.

When the second redistribution layer 240 is made of silver (Ag), a high coupling force is demonstrated between the second redistribution layer 240 and a conductive ball to be formed in a later step. In addition, when the second redistribution layer 240 is made of nickel (Ni), a high coupling force is demonstrated between the second redistribution layer 240 and each of the first dielectric layer 120 and a second dielectric layer to be formed in a later step. Therefore, the use of the materials listed above may increase a coupling force between the second redistribution layer 240 and another layer.

Figure 7:
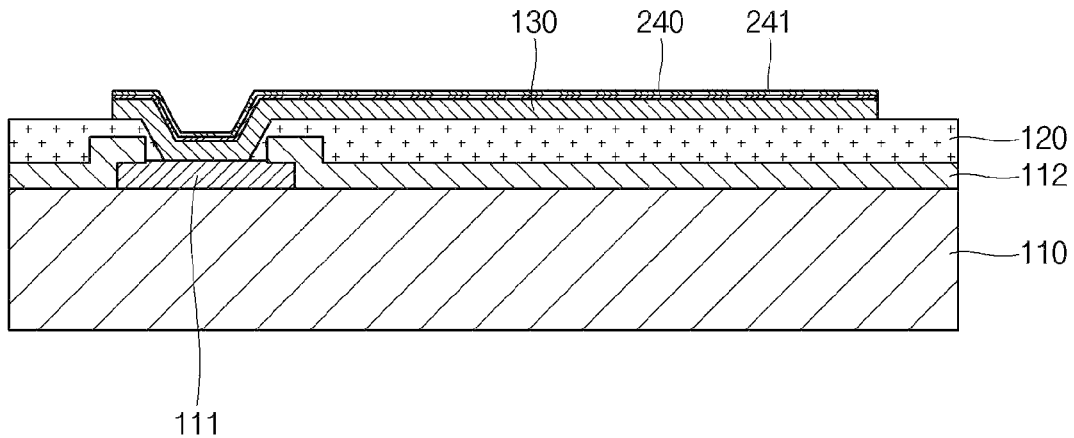

Referring to FIG. 7, an oxide layer 241 may be formed on the second redistribution layer 240. Since the oxide layer 241 is very thin and has a high density, it may prevent the first redistribution layer 130 from being oxidized.

Figure 8:
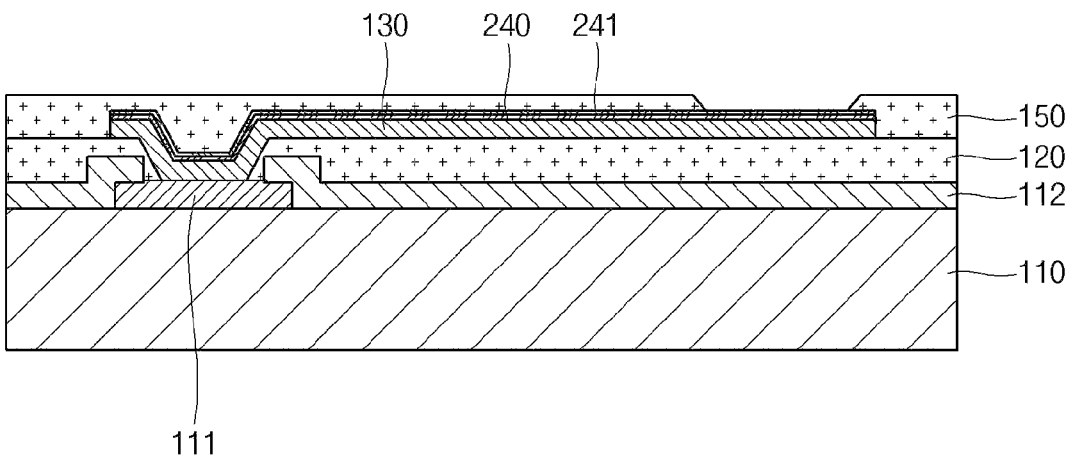
Figure 9:
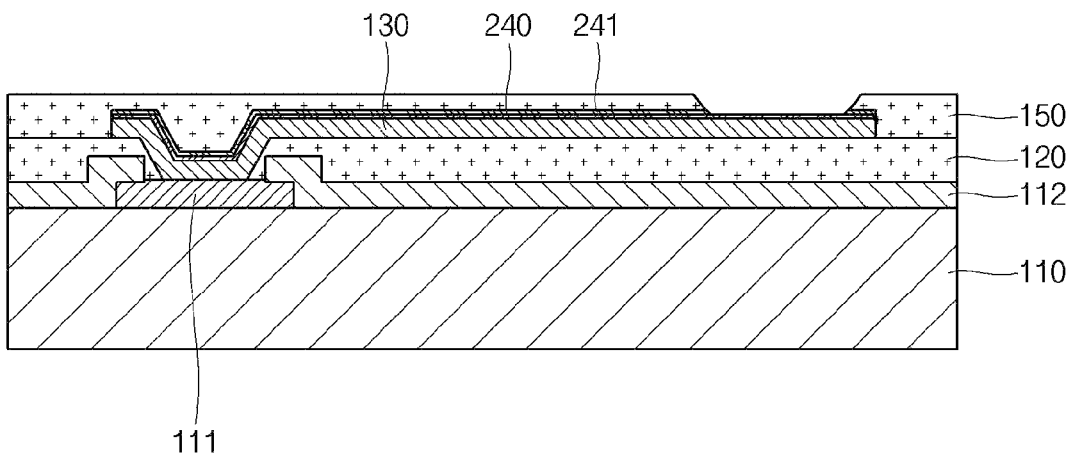
Figure 10:
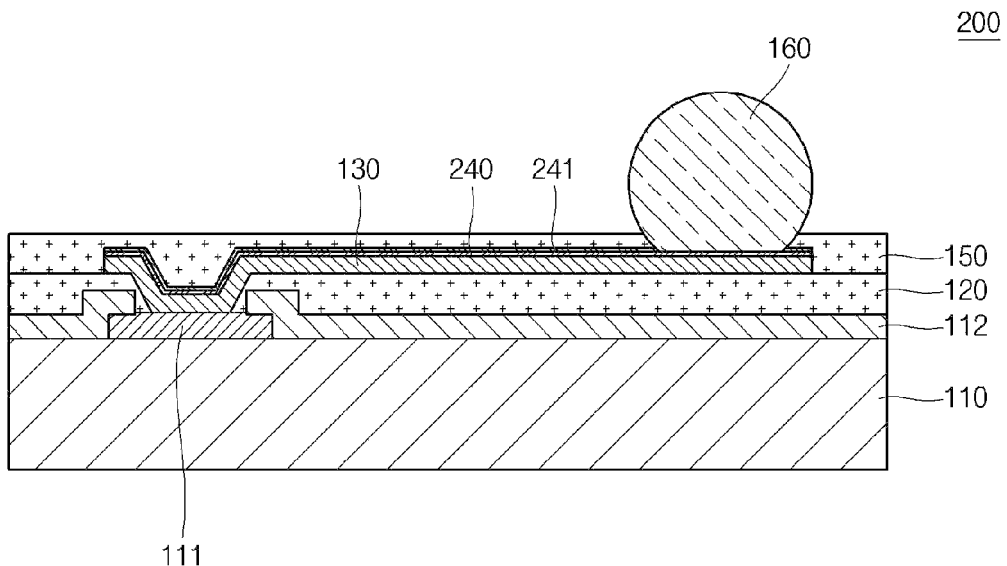

Referring to FIG. 8, a second dielectric layer 150 is formed to surround the second redistribution layer 240 and the oxide layer 241. In addition, referring to FIG. 9, the oxide layer 241 is removed from a region exposed by the second dielectric layer 150. The removal of the oxide layer 241 may be performed by the flux, but the scope of this disclosure is not limited thereto. Next, as illustrated in FIG. 10, a conductive ball 160 is coupled to the exposed second redistribution layer 240, thereby fabricating the semiconductor device 200 according to another embodiment of the present invention.

A fabricating method of a semiconductor device according to still another embodiment of the present invention will now be described with reference to FIGS. 11 through 15.

FIGS. 11 through 15 are cross-sectional views illustrating a fabricating method of a semiconductor device according to still another embodiment of the present invention.

Figure 11:
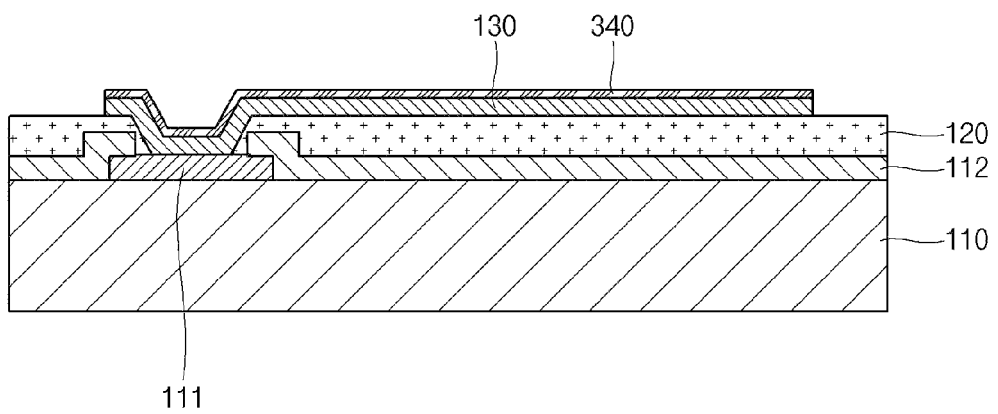
FIGS. 11 through 15 are cross-sectional views illustrating a method of manufacturing of a semiconductor device, according to still another embodiment of the present invention.

Referring to FIG. 11, the fabricating method of a semiconductor device (300) according to still another embodiment of the present invention may first include forming a first dielectric layer 120, a first redistribution layer 130 (or conductive layer) and a second redistribution layer 340 (or conductive layer) on a top surface of a semiconductor die 110.

Here, the second redistribution layer 340 may be made of nickel (Ni), but the scope of this disclosure is not limited thereto. In addition, the second redistribution layer 340 may be formed to have a relatively large thickness, e.g., 2 μm or greater. The second redistribution layer 340 is thicker than the second redistribution layer 240 of the previous embodiment and may serve as a under bump metal (UBM) for a conductive ball 160 to be later coupled thereto. That is to say, the second redistribution layer 340 may increase its coupling force with respect to the conductive ball 160. If the second redistribution layer 340 made of nickel (Ni) has a thickness of 2 μm or greater, it may react with a tin (Sn) component of the conductive ball 160 to form an intermetallic compound.

In addition, a thickness of the first redistribution layer 130 may be reduced by the second redistribution layer 340. If the second redistribution layer 340 is formed to have a thickness of 2 μm, a required thickness of the first redistribution layer 130 may be reduced from 9 μm to 3 μm. Therefore, the second redistribution layer 340 can reduce the fabricating cost and time required for the first redistribution layer 130.

Figure 12:
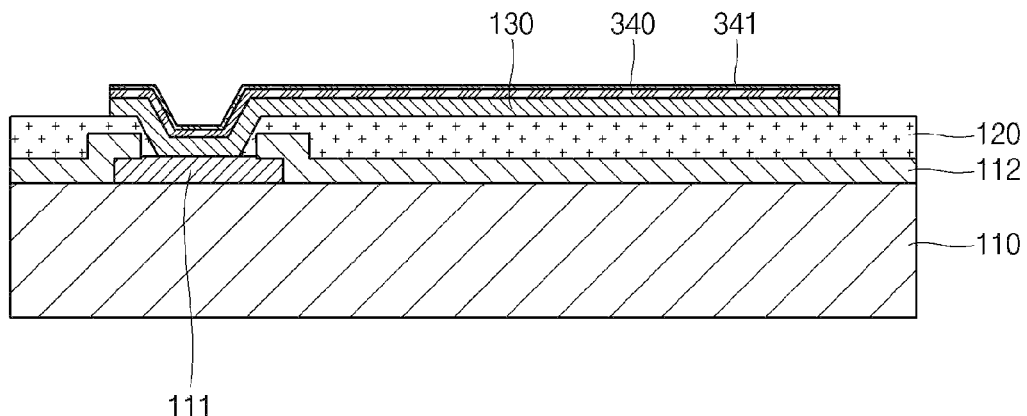

Referring to FIG. 12, an oxide layer 341 may be formed on the second redistribution layer 340. Since the oxide layer 341 is very thin and has a high density, it may prevent the first redistribution layer 130 from being oxidized.

Figure 13:
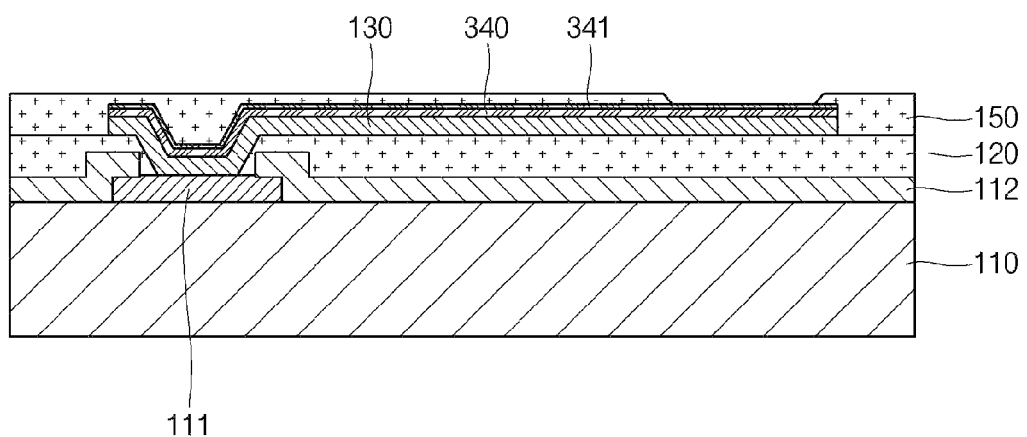
Figure 14:
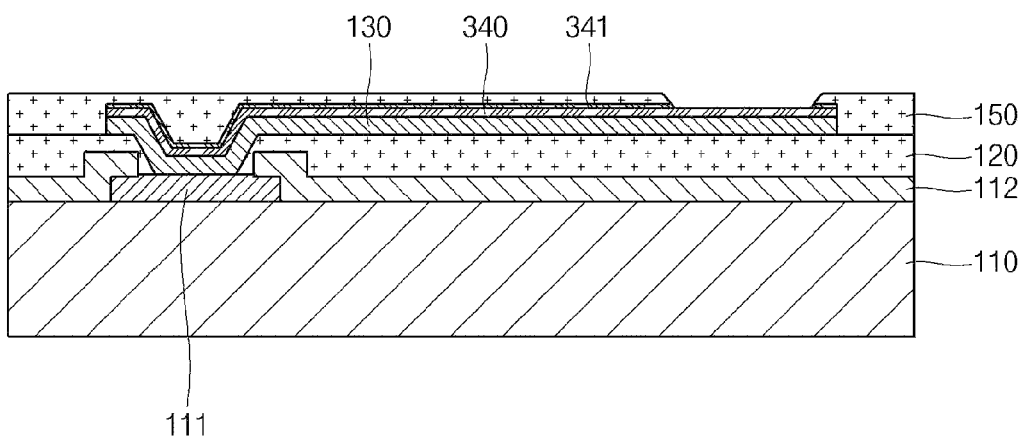
Figure 15:
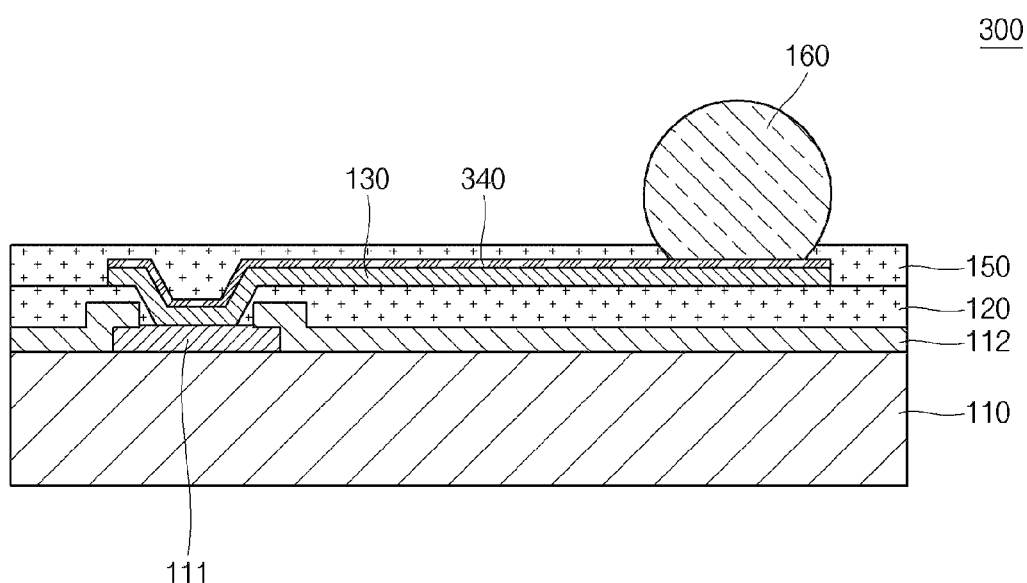

Referring to FIG. 13, a second dielectric layer 150 is formed to surround the second redistribution layer 340 and the oxide layer 341. In addition, referring to FIG. 14, the oxide layer 341 is removed from a region exposed by the second dielectric layer 150. The removal of the oxide layer 341 may be performed by the flux, but the scope of this disclosure is not limited thereto. Next, as illustrated in FIG. 15, a conductive ball 160 is coupled to the exposed second redistribution layer 340. As described above, the second redistribution layer 340 may react with a tin (Sn) component of the conductive ball 160 to form an intermetallic compound to achieve stable coupling between the conductive ball 160 and the second redistribution layer 340, thereby fabricating the semiconductor device 300 according to still another embodiment of the present invention.

Hereinafter, a fabricating method of a semiconductor device according to still another embodiment of the present invention will be described.

FIGS. 16 through 19 are cross-sectional views illustrating a fabricating method of a semiconductor device according to still another embodiment of the present invention.

Figure 16:
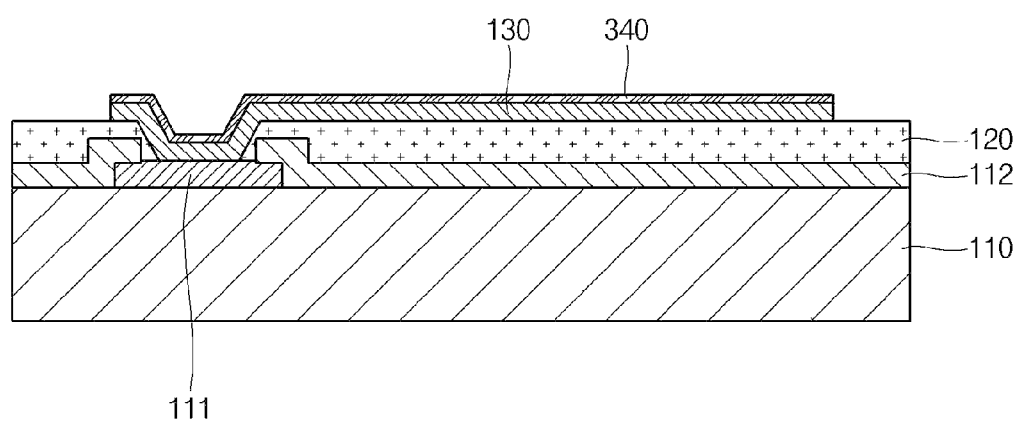
FIGS. 16 through 19 are cross-sectional views illustrating a method of manufacturing of a semiconductor device, according to still another embodiment of the present invention.

Referring to FIG. 16, the fabricating method of a semiconductor device (400) according to still another embodiment of the present invention may first include forming a first dielectric layer 120, a first redistribution layer 130 and a second redistribution layer 340 on a surface of a semiconductor die 110.

Like in the previous embodiment, the second redistribution layer 340 may be made of nickel (Ni). In addition, the second redistribution layer 340 may be formed to have a relatively large thickness, e.g., 2 μm or greater.

Figure 17:
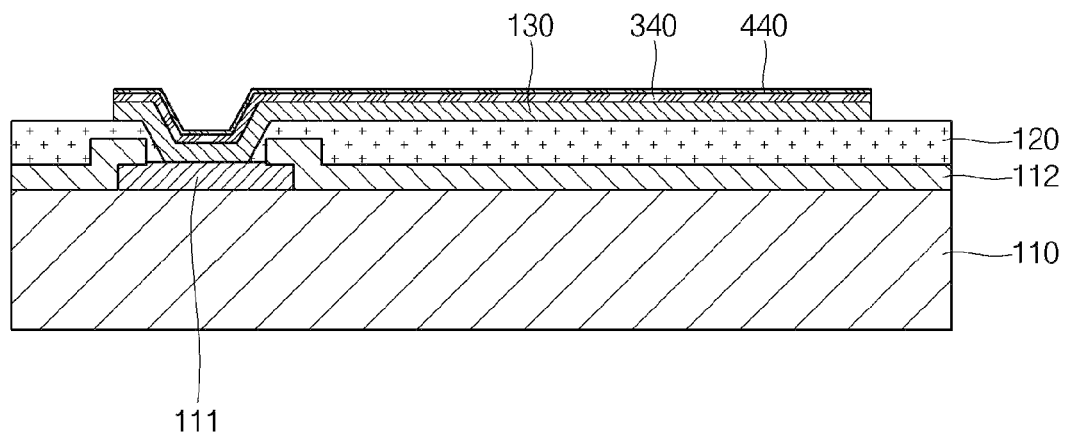

Referring to FIG. 17, a third redistribution layer 440 (or conductive layer) may be formed on the second redistribution layer 340. The third redistribution layer 440 has the same shape with the second redistribution layer 340 and is formed along the top surface of the second redistribution layer 340. The third redistribution layer 440 may be formed by electroplating or electroless plating. The third redistribution layer 440 may be made of gold (Au), but the scope of this disclosure is not limited thereto. Since no oxide layer is formed from gold (Au), the third redistribution layer 440 may prevent the second redistribution layer 340 and the first redistribution layer 130 from being oxidized.

Therefore, like in the aforementioned embodiments, the second redistribution layer 340 and the third redistribution layer 440 may prevent the first redistribution layer 130 from being oxidized, thereby preventing delamination.

Figure 18:
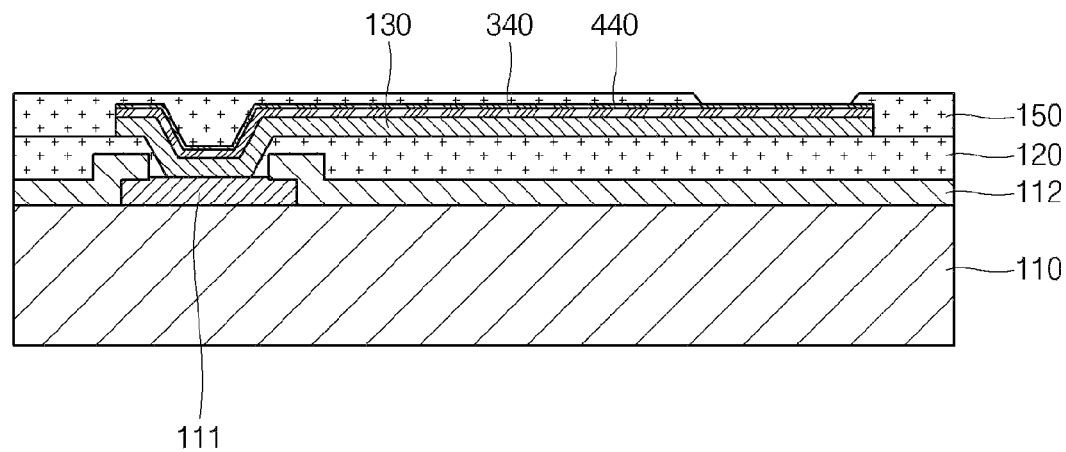
Figure 19:
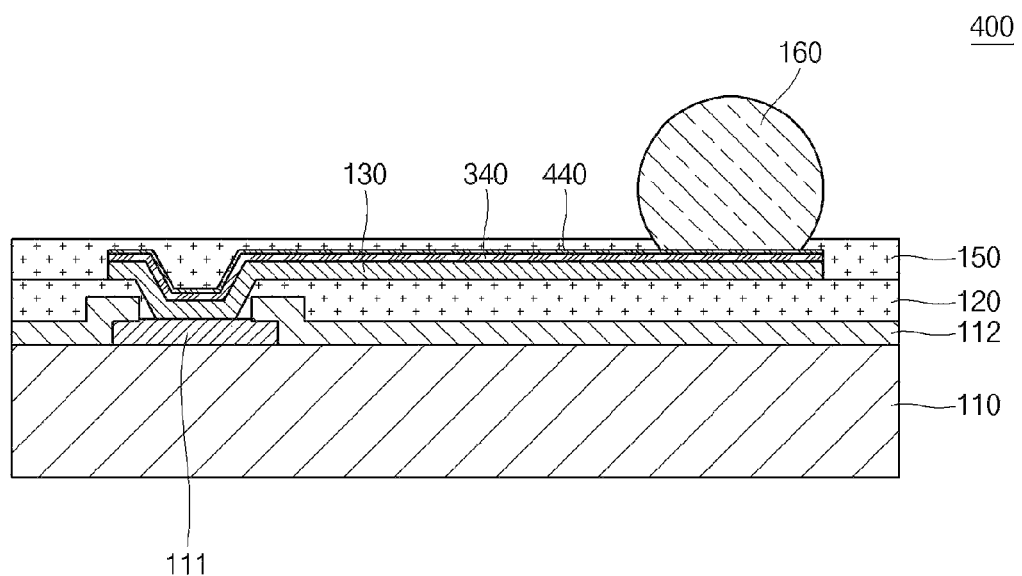

Referring to FIG. 18, a second dielectric layer 150 is formed to surround the second redistribution layer 340 and the third redistribution layer 440. Next, referring to FIG. 19, a conductive ball 160 is coupled to the exposed third redistribution layer 440, thereby fabricating the semiconductor device 400 according to still another embodiment of the present invention.

Hereinafter, a fabricating method of a semiconductor device according to still another embodiment of the present invention will be described.

FIGS. 20 through 24 are cross-sectional views illustrating a fabricating method of a semiconductor device according to still another embodiment of the present invention.

Figure 20:
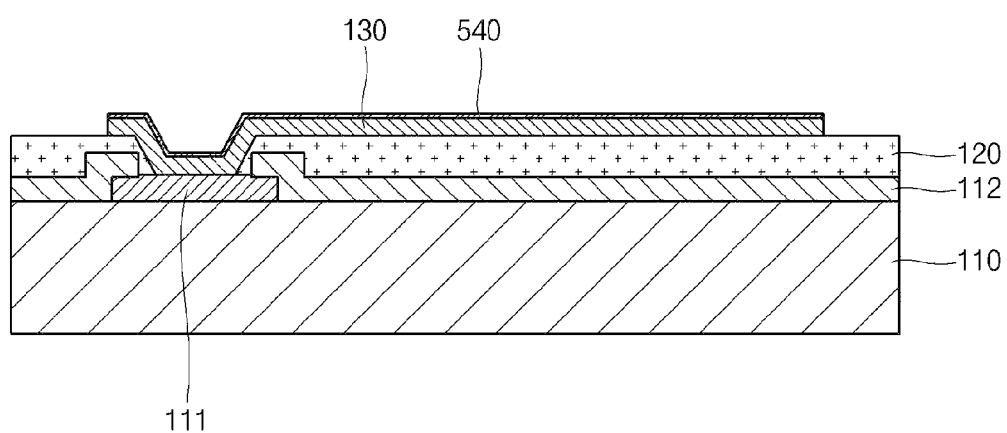
FIGS. 20 through 24 are cross-sectional views illustrating a method of manufacturing of a semiconductor device, according to still another embodiment of the present invention.

Referring to FIG. 20, the fabricating method of a semiconductor device (500) according to still another embodiment of the present invention may first include forming a first dielectric layer 120, a first redistribution layer 130 and a second redistribution layer 540 on a top surface of a semiconductor die 110.

Here, the second redistribution layer 540 (or conductive layer) may have the same shape with the first redistribution layer 130 and may be formed on a top surface of the first redistribution layer 130.

The second redistribution layer 540 may be made of at least one selected from the group consisting of titanium (Ti), titanium-tungsten alloy (TiW), aluminum (Al) and chromium (Cr) (or chrome), which demonstrate a high coupling force between the first dielectric layer 120 and the second dielectric layer 150, but the scope of this disclosure is not limited thereto. Specifically, titanium (Ti) or titanium-tungsten alloy (TiW) may be advantageously used owing to its high coupling force with respect to a conductive ball 160 to be later coupled.

Figure 21:
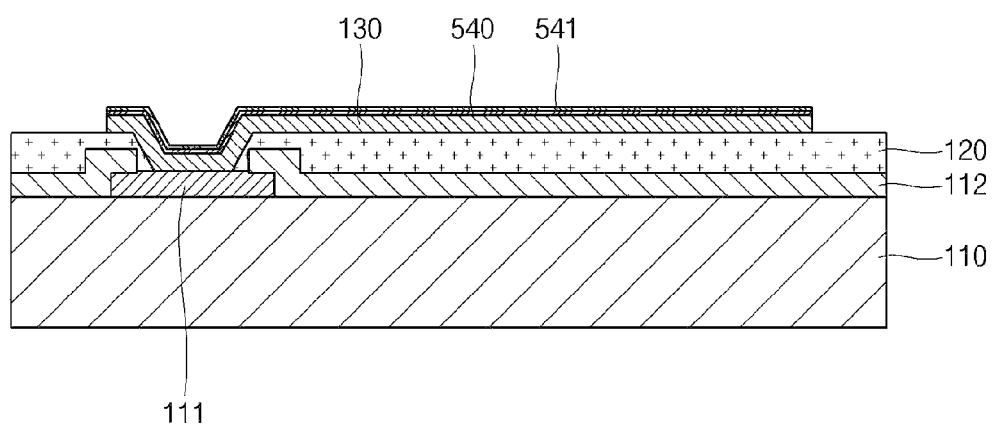

Referring to FIG. 21, an oxide layer 541 may be formed on the second redistribution layer 540. Since the oxide layer 541 is very thin and has a high density, it may prevent the first redistribution layer 130 from being oxidized.

Figure 22:
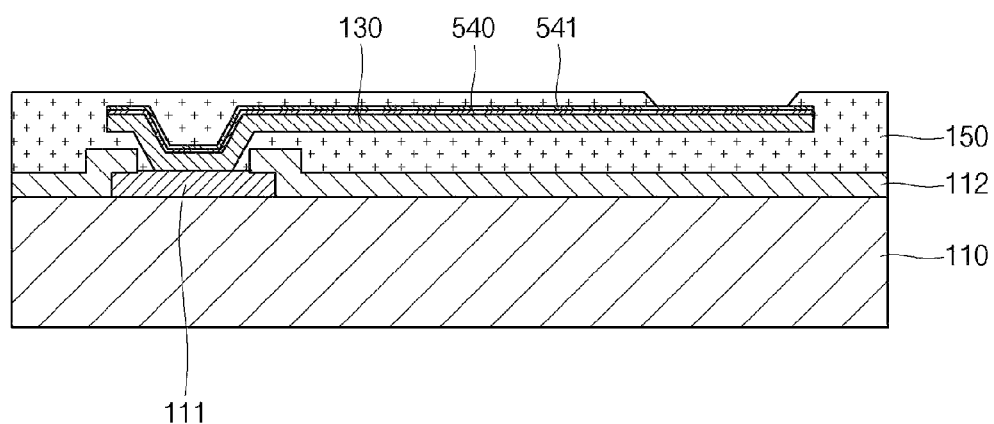
Figure 23:
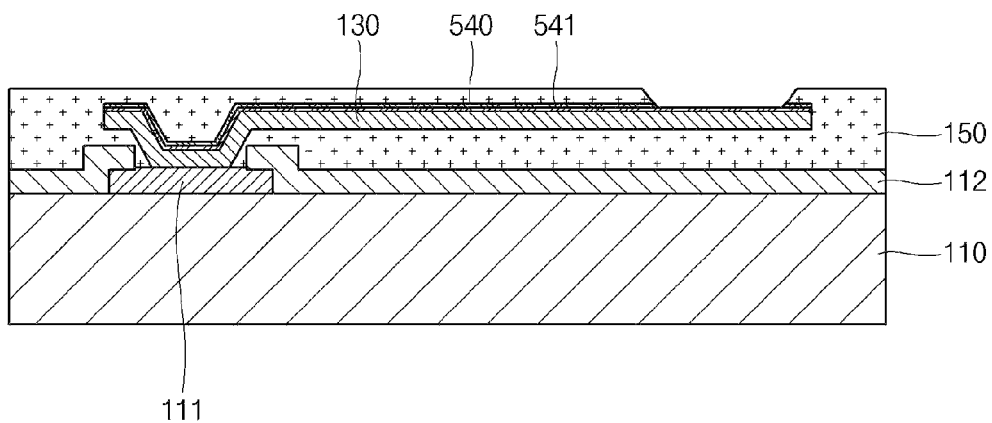
Figure 24:
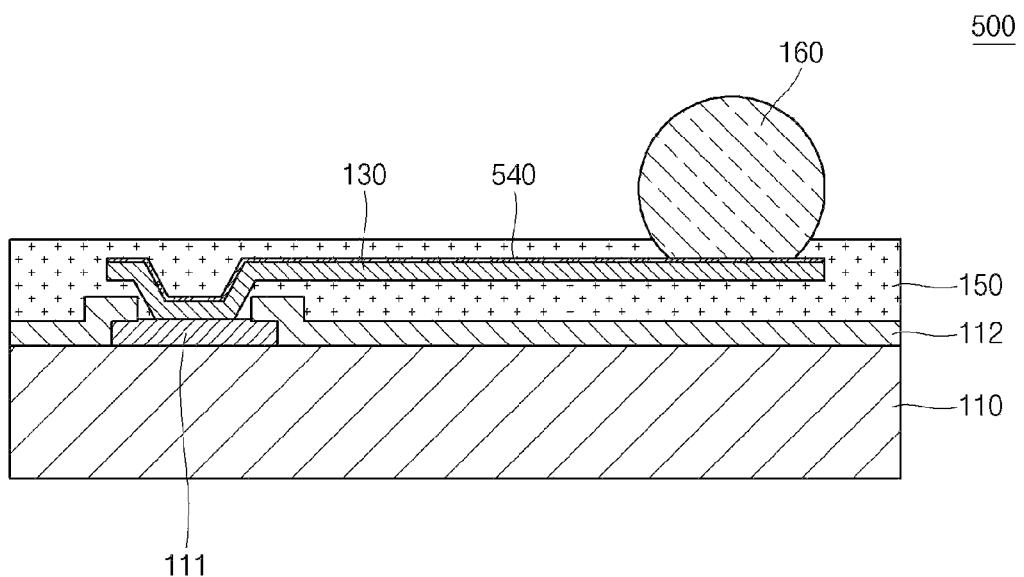

Referring to FIG. 22, a second dielectric layer 150 is formed to surround the second redistribution layer 540 and the oxide layer 541. In addition, referring to FIG. 23, the oxide layer 541 is removed from a region exposed by the second dielectric layer 150. The removal of the oxide layer 541 may be performed by the flux, but the scope of the present disclosure is not limited thereto. Next, as illustrated in FIG. 24, a conductive ball 160 is coupled to the exposed second redistribution layer 540, thereby fabricating the semiconductor device 500 according to another embodiment of the present invention The discussion herein included numerous illustrative figures that showed various portions of an electronic device assembly and method of manufacturing thereof. For illustrative clarity, such figures did not show all aspects of each example assembly. Any of the example assemblies and/or methods provided herein may share any or all characteristics with any or all other assemblies and/or methods provided herein.

In summary, various aspects of this disclosure provide a semiconductor device and a method of manufacturing a semiconductor device. As a non-limiting example, various aspects of this disclosure provide a semiconductor package, and method of manufacturing thereof, that comprises a signal redistribution structure that comprises an anti-oxidation layer. While the foregoing has been described with reference to certain aspects and examples, it will be understood by those skilled in the art that various changes may be made and equivalents may be substituted without departing from the scope of the disclosure. In addition, many modifications may be made to adapt a particular situation or material to the teachings of the disclosure without departing from its scope. Therefore, it is intended that the disclosure not be limited to the particular example(s) disclosed, but that the disclosure will include all examples falling within the scope of the appended claims.

What is claimed is:

1. A semiconductor device comprising:
   a semiconductor die comprising a first die surface and a conductive pad on the first die surface;
   a first dielectric layer (DL) on the first die surface and comprising a first DL opening through which the conductive pad is exposed;
   a first redistribution layer comprising a first conductive layer on the first dielectric layer and in the first DL opening, where the first conductive layer is electrically connected to the conductive pad through the first DL opening;
   a second redistribution layer comprising a second conductive layer on at least a top side of the first conductive layer, wherein the second conductive layer is thinner than the first conductive layer;
   an anti-oxidation layer that is directly on at least a top side of the second conductive layer and is thinner than the first conductive layer; and
   a second dielectric layer on the anti-oxidation layer and comprising a second DL opening that is laterally displaced from the first DL opening and through which a first portion of a top side of the second conductive layer is exposed,
   wherein the anti-oxidation layer covers at least a second portion of the top side of the second conductive layer that is not exposed through the second DL opening, such that the second dielectric layer does not directly contact the top side of the second conductive layer.

2. The semiconductor device of claim 1, wherein:
   the second conductive layer covers the entire first conductive layer; and
   the first portion of the top side of the second conductive layer that is exposed through the second dielectric layer is exposed through only a single aperture in the anti-oxidation layer; and
   at least a portion of a lateral side surface of the second conductive layer is free of the anti-oxidation layer.

3. The semiconductor device of claim 1, wherein the anti-oxidation layer comprises an oxide layer formed on the second conductive layer.

4. The semiconductor device of claim 3, wherein the second conductive layer comprises an intermetallic compound on which the oxide layer is formed.

5. The semiconductor device of claim 1, comprising a conductive ball on the second conductive layer and extending through the second DL opening, wherein the conductive ball directly contacts the first portion of the top side of the second conductive layer, directly contacts a lateral side of the second dielectric layer, and directly contacts only a lateral side of the anti-oxidation layer.

6. The semiconductor device of claim 1, wherein:
   the first conductive layer is no more than 3 microns thick; and
   the second conductive layer is at least 2 microns thick.

7. The semiconductor device of claim 6, wherein:
   the first conductive layer comprises copper; and
   the second conductive layer comprises nickel.

8. The semiconductor device of claim 1, wherein the second conductive layer comprises a copper-tin intermetallic compound.

9. The semiconductor device of claim 1, wherein the first conductive layer comprises copper (Cu), and the second conductive layer comprises: tin (Sn), silver (Ag), nickel (Ni), titanium (Ti), titanium-tungsten alloy (TiW), aluminum (Al), and/or chromium (Cr).

10. The semiconductor device of claim 1, wherein an intermetallic compound is formed at an interface between the second conductive layer and the first conductive layer.

11. A method of manufacturing a semiconductor device, the method comprising:
   providing a semiconductor die that comprises a first die surface and a conductive pad on the first die surface;
   forming a first dielectric layer (DL) on the first die surface and comprising a first DL opening through which the conductive pad is exposed;
   forming a first redistribution layer comprising a first conductive layer on the first dielectric layer and in the first DL opening, where the first conductive layer is electrically connected to the conductive pad through the first DL opening;
   forming a second redistribution layer comprising a second conductive layer on the first conductive layer, wherein the second conductive layer is thinner than the first conductive layer, and wherein an anti-oxidation layer is directly on a top side of the second conductive layer, and the anti-oxidation layer is thinner than the first conductive layer; and
   forming a second dielectric layer on the anti-oxidation layer and comprising a second DL opening that is laterally displaced from the first DL opening and through which a first portion of a top side of the second conductive layer is exposed,
   wherein the anti-oxidation layer covers at least a second portion of the top side of the second conductive layer that is not exposed through the second DL opening, such that the second dielectric layer does not directly contact the top side of the second conductive layer.

12. The method of claim 11, comprising: forming the anti-oxidation layer on the second conductive layer.

13. The method of claim 11, wherein:
the second conductive layer covers the entire first conductive layer; and
the first portion of the top side of the second conductive layer that is exposed through the second dielectric layer is exposed through only a single aperture in the anti-oxidation layer; and
at least a portion of a lateral side surface of the second conductive layer is free of the anti-oxidation layer.

14. The method of claim 11, wherein the anti-oxidation layer comprises an oxide layer formed on the second conductive layer, and the method comprises utilizing a flux to remove a portion of the anti-oxidation layer exposed from the second dielectric layer by the second DL opening.

15. The method of claim 11, comprising forming a conductive ball on the second conductive layer and extending through the second DL opening, wherein the conductive ball directly contacts the first portion of the top side of the second conductive layer, directly contacts a lateral side of the second dielectric layer, and directly contacts only a lateral side of the anti-oxidation layer.

16. The method of claim 11, wherein:
the first conductive layer is no more than 3 microns thick; and
the second conductive layer is at least 2 microns thick.

17. The method of claim 16, wherein:
the first conductive layer comprises a copper layer; and
the second conductive layer comprises a nickel layer.

18. The method of claim 11, wherein the second conductive layer comprises a copper-tin intermetallic compound.

19. The method of claim 11, wherein the first conductive layer comprises copper (Cu), and the second conductive layer comprises: tin (Sn), silver (Ag), nickel (Ni), titanium (Ti), titanium-tungsten alloy (TiW), aluminum (Al), and/or chromium (Cr).

20. A method of manufacturing a semiconductor device that includes a semiconductor die that comprises a first die surface and a conductive pad on the first die surface, and a first dielectric layer (DL) on the first die surface, the method comprising:
forming a first redistribution layer comprising a first conductive layer over the first dielectric layer and electrically connected to the conductive pad through a first DL opening in the first dielectric layer, where the first conductive layer comprises copper (Cu); and
forming a second redistribution layer comprising a second conductive layer directly on and completely covering the first conductive layer, wherein the second conductive layer is thinner than the first conductive layer and comprises: tin (Sn), silver (Ag), nickel (Ni), titanium (Ti), titanium-tungsten alloy (TiW), aluminum (Al), and/or chromium (Cr), and wherein an anti-oxidation layer is directly on a top side of the second conductive layer, the anti-oxidation layer is thinner than the first conductive layer, and the anti-oxidation layer comprises an oxide layer that protects the first conductive layer;
forming a second dielectric layer on the anti-oxidation layer and comprising a second DL opening that is laterally displaced from the first DL opening and through which an exposed portion of the anti-oxidation layer is exposed; and
removing the exposed portion of the anti-oxidation layer.

* * * * *